United States Patent [19]

Hisada et al.

[11] Patent Number: 5,068,685
[45] Date of Patent: Nov. 26, 1991

[54] IMAGE RECORDING APPARATUS USING MASK MEMBERS AND HAVING MONOCHROMATIC PRINTER PORTION AND MANUAL MASK MEMBER INSERTION TRAY

[75] Inventors: Hidenori Hisada, Tokoname; Makoto Suzuki, Nagoya, both of Japan

[73] Assignee: Brother Kogyo Kabushiki Kaisha, Nagoya, Japan

[21] Appl. No.: 634,460

[22] Filed: Dec. 27, 1990

[30] Foreign Application Priority Data

Jan. 29, 1990 [JP] Japan ................................. 2-18172
Feb. 22, 1990 [JP] Japan ................................. 2-41603

[51] Int. Cl.$^5$ .................... G03B 27/32; G03B 27/52
[52] U.S. Cl. .................................. 355/32; 355/27; 355/32
[58] Field of Search ................... 355/27, 32, 35, 40

[56] References Cited

U.S. PATENT DOCUMENTS

| | | | |
|---|---|---|---|
| 4,864,353 | 9/1989 | Okamoto | 355/27 |
| 4,942,419 | 7/1990 | Nakai et al. | 355/27 |
| 4,967,227 | 10/1990 | Suzuki et al. | 355/27 |
| 5,016,042 | 5/1991 | Yamamoto et al. | 355/27 |

*Primary Examiner*—Monroe H. Hayes
*Attorney, Agent, or Firm*—Oliff & Berridge

[57] ABSTRACT

An image recording apparatus capable of providing an intended numbers of output copies regardless of the mask member feed mode. A set of the mask members are automatically fed from a laser printer to a color copying portion after the set is produced at the laser printer. Further, another set of mask members already on hand can also be set on a mask member tray, and the another set can be delivered to the color copying portion. The mask members are normally printed with bar codes indicative of the numbers of the output copies. The bar codes can be invalidated in case of the mask feed mode from the tray, and newly input numbers of copies are obtainable in the mask feed mode from the tray.

7 Claims, 6 Drawing Sheets

IMAGE RECORDING APPARATUS USING MASK MEMBERS AND HAVING MONOCHROMATIC PRINTER PORTION AND MANUAL MASK MEMBER INSERTION TRAY

BACKGROUND OF THE INVENTION

The present invention relates to an image recording apparatus for recording a color image on a photosensitive recording medium using mask members. More specifically, the invention relates to such apparatus in which a photosensitive pressure sensitive recording medium is exposed to light through a selected one of the mask members for forming a latent image on the medium, and a developer medium is superposed with the photosensitive medium for pressure development to produce a color visible image on the developer medium.

Conventionally, red, green and blue mask members are produced based on an imaging information so as to selectively allow particular light to pass therethrough. Each of the mask members is produced in, for example, a laser beam printer. The mask member is of a light shieldable monochromatic image indicative of particular color of the imaging information. Three mask members are successively placed on an identical area of the photosensitive recording medium for performing exposures at three times for obtaining a latent image thereon. The photosensitive pressure sensitive recording medium includes a base film formed of a polyester and immense numbers of photosensitive microcapsules coated on the base film, the microcapsules encapsulating therein materials reactable with red, green and blue lights. The developer medium includes a base substrate formed of a plain paper and developer materials coated thereover. Upon light exposure, physical property of the microcapsules is changed, for example, the light exposed microcapsules may be mechanically hardened, whereas unexposed microcapsules may be rupturable upon pressure to release the encapsulated materials for the reaction with the developer material coated on the developer medium. In this connection a related art is described in U.S. Pat. Nos. 4,884,082 and 4,949,185.

In a conventional image recording apparatus, provided are the laser beam printer for producing the mask members which are successively introduced into the color image forming device. Therefore, automatic feeding of the mask members from the laser beam printer to the color image forming device is carried out. Further, in the conventional image recording apparatus, a manual mask insertion tray is provided. If another mask members have been prepared, the thus prepared mask members are manually inserted into the color image forming device.

With such conventional arrangement, copying numbers are set. The setting of the copying numbers is required for obtaining a desired plurality of numbers of identical output copying images. However, since the two routes are provided with respect to feed of the mask members to the color image forming device, i.e., feeding from the laser beam printer and from the manual insertion tray, the setting of the copying number may accompany difficulty or trouble.

SUMMARY OF THE INVENTION

It is therefore, an object of the invention to provide an improved image recording apparatus in which intended copying numbers are obtainable in both case of the mask member feed from the printer as well as the mask member feed from a mask member feed tray.

These and other objects of the invention will be attained by providing an image recording apparatus for recording a color image with using mask members, each of the mask members being formed with a light shieldable mask image and each of the mask members being successively fed toward a photosensitive recording medium at an exposure position for superposedly forming latent images thereon upon exposures, the apparatus comprising a printer portion for producing the mask members, the printer portion providing an automatic mask member feed mode and also providing means for indicating copying numbers for the automatic feed mode with respect to the mask members, a color image forming portion for forming a output color image with using the mask members, each of the mask members being introducible from the printer portion to the color image forming portion along a first path, the photosensitive recording medium and the exposure position being positioned within the color image forming portion, sheet feed means for manually setting another set of mask members and for introducing the another set into the color image forming portion along a second path, the sheet feed means providing a manual mask member feed mode, means for inputting another copying numbers in case of the manual mask member feed mode, and means for invalidating the copying numbers indicated by the indication means and for predominating the another copying numbers if the manual mask member feed mode is selected.

DETAILED DESCRIPTION OF THE PREFERRED EMBODIMENTS

Figure 1:
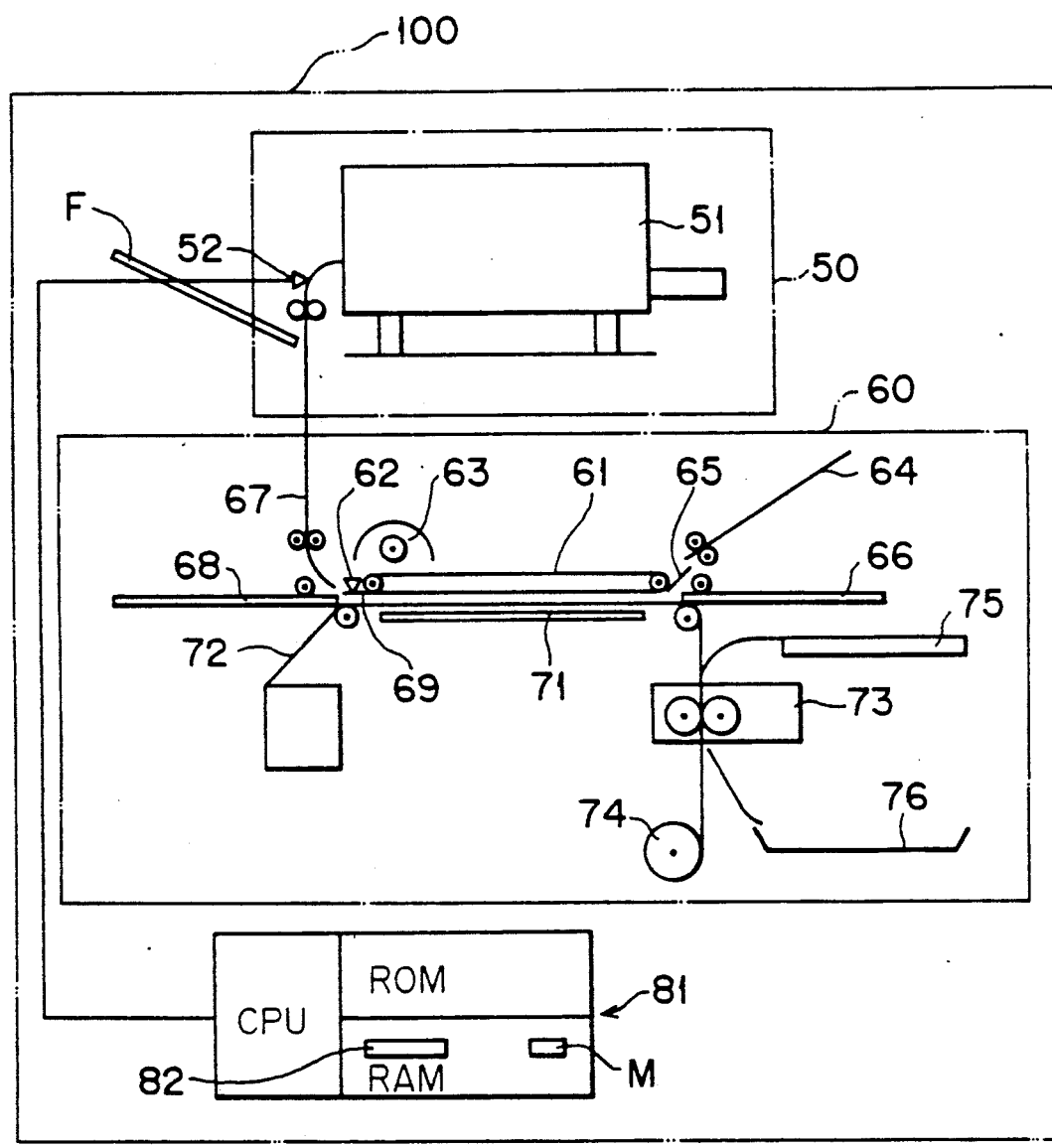
FIG. 1 is a schematic view showing an image recording apparatus using mask members according to an inhouse proposal on which the present invention has been based.
Figure 2:
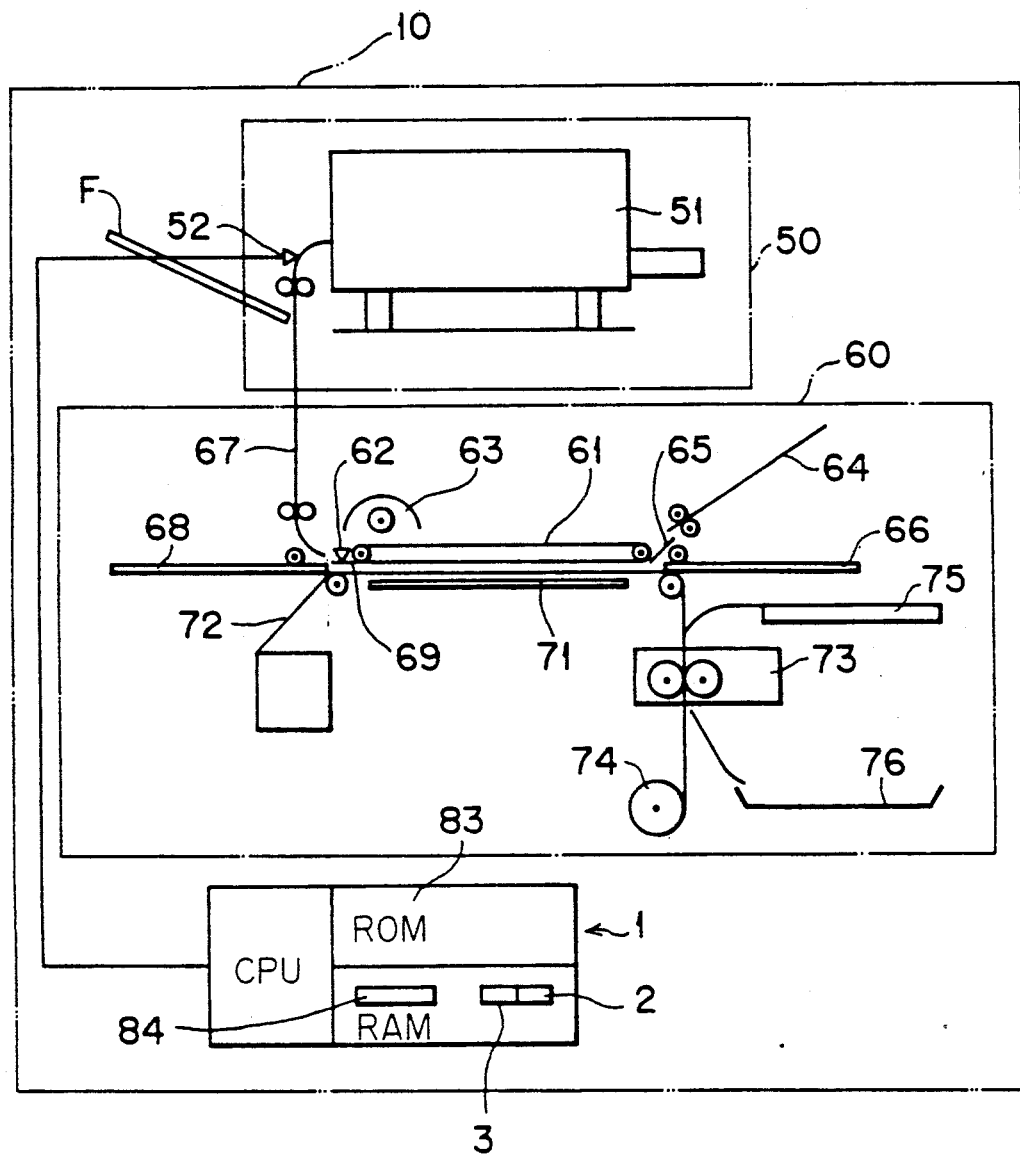
FIG. 2 is a schematic view showing an image recording apparatus using mask members according to a first embodiment of this invention.

One example of an image recording apparatus according to an inhouse proposal is shown in FIG. 1. As described above, two kinds of mask member feed modes are provided. In a first method, the mask members are directly fed from the laser printer to the color image forming device. In this case, a bar code is provisionally printed on the mask member in the laser printer which bar code is indicative of the desired numbers of copying. This bar code is read by a bar code reader and the read data is stored in a memory so as to produce the desired numbers of the output copying images. On the other hand, in a second method, an automatic sheet feeder is provided at a position between the laser printer and the color image forming device. The automatic sheet feeder serves as a manual mask member insertion tray for manually inserting the mask members into the color image forming device. In the latter case, a key switch is provided for setting a desired numbers of the output copying image so as to produce the desired numbers of the output copying image in the color image forming device. In the following description, in case the mask member is printed on the printer and the mask member is automatically transferred to the color copying portion, such feed mode will be referred to "automatic mode". On the other hand, in case the mask member already obtained is manually set on the automatic sheet feed tray, and the thus set mask members are transferred to the color forming portion, such feed mode will be referred to "manual mode".

The image recording apparatus according to the in-house proposal will first be described in detail with reference to FIG. 1. The image recording apparatus 100 includes a printer portion 50 and a color image recording portion 60. In the printer portion 50, monochromatic mask members are produced, and further, bar code is also printed on the mask member in the printer portion 50, monochromatic mask members are produced, and further, bar code is also printed on the mask member in the printer portion 50, the bar code being indicative of the copying numbers of the color output image to be produced in the image recording portion 60. Furthermore, a positioning mark is also printed on the mask member. Apparently, the positioning mark and the bar code data are printed at non-imaging area of the mask member. The printer portion 50 includes a printer 51, a discharge tray (not shown) for discharging the monochromatic mask member out of the printer 51, and a mask member sensor 52 for detecting the same. The color image recording portion 60 produces a color hard copy or a visible image by exposing the photosensitive pressure sensitive sheet to light through the mask member, and the light exposed photosensitive pressure sensitive sheet is subjected to pressure developing operation in conjunction with the developer sheet to provide the color output image thereon.

The mask members produced in the printer portion 50 can be automatically delivered to the color image recording portion 60 through the discharge tray (not shown). Alternatively, another mask members those previously produced can be manually inserted into the color image recording portion 60. In the latter case, the mask members can be manually set on an automatic sheet feeder F positioned between the printer portion 50 and the color image recording portion 60.

For feeding the mask members produced at the printer portion 50 to the color image recording portion 60, a guide member G is provided. The guide member G is connected to a mask member feed passage 67 extending into the color image recording portion 60. In the color image recording portion, a mask position adjusting unit 61 is provided for precisely positioning the mask member relative to a photosensitive pressure sensitive recording medium 72. To this effect, a positioning mark sensor is provided at the mask position adjusting unit 61.

At a position above the mask position adjusting unit 61, an exposure unit 63 including a light source is provided, and at a position below the mask position adjusting unit 61, a contact plate 71 is provided for selectively contacting the mask member with the photosensitive pressure sensitive recording medium 72. At an inlet portion of the mask position adjusting unit 61, a bar code sensor 62 is provided for reading copying numbers.

At a downstream side of the mask position adjusting unit 61, provided are a first storage tray 64 and a sheet discharge tray 66 serving as a second storage tray for temporarily storing the exposed mask member. Further, at an exit end of the mask position adjusting unit 61, a gate 65 is provided for selectively directing the mask member to one of the first and the second storage trays 64 and 66. Furthermore, the mask member feed passage 67 serves as a third storage tray, and a fourth storage tray 68 is provided at a position immediately upstream of the mask position adjusting unit 61. A second gate 68 is provided for selectively directing the light exposed mask member to one of the third and the fourth storage trays 67 and 68.

A pressure developing unit 73 is disposed downstream of the exposure unit 63, and a developer medium 75 is adapted to be fed to the pressure developing unit 73. Further, a takeup unit 74 is provided for winding the light exposed photosensitive pressure sensitive recording medium 72 thereover, and a discharge tray 76 is provided for receiving the developer medium 75 on which an output image is formed.

A controller 81 is provided for controlling overall operation of the image recording apparatus 60. The controller 81 includes a CPU, a ROM, and a RAM 82 having a memory region M in which stored are data of numbers of copying read from the bar code printed on the mask member in case of the mask member feeding from the laser printer and data of number of copying inputted from the key board in case of the manual insertion of the mask member.

If the mask member produced at the printer portion 50 is introduced into the color image recording portion 60, the mask member is fed past the guide member G and the mask member sensor 52. In this case, the manual insertion flag on the RAM 82 undergoes resetting. (here, the manual insertion flag is indicative of the manual insertion of the mask member). The mask member then reaches the mask position adjusting unit 61. In this case, the mask member is subjected to precise position adjustment, and the bar code sensor 61 reads the numbers of the copying times. After the position adjustment, the photosensitive pressure sensitive recording medium 72 is exposed to light of specific color. The mask member is then delivered to the first storage tray 64 by the operation of the gate 65 controlled by the controller 81. Similarly, subsequent mask members are brought to the exposure position, and is delivered to the second storage tray 66 and one of the third and fourth storage trays 67 and 68 by the operation of the gate 69.

The photosensitive recording medium 72 is fed past the contact plate 71, and is wound over the takeup unit 74 through the pressure developing unit 73. When the medium 72 passes the pressure developing unit 73, the developer medium 75 is superposed with the photosensitive recording medium 72, and these mediums are pressed together for providing a visible image on the developer medium 75. The latter is then discharged onto the discharge tray 76.

In order to produce a plurality of output images by the same set of the mask members, as described above, the set of the mask members are successively introduced from the printer portion 50 into the color image recording portion 60. In this case, the bar code printed at the printer 51 is read by the bar code sensor 62, and the detected numbers are stored in the controller 81. Therefore, the color image recording portion 50 is repeatedly operated for producing the desired numbers of the output images based on the stored value.

On the other hand, if another set of mask members are manually inserted through the automatic sheet feeder F, an operator manipulates a key board (not shown) for inputting the desired copying numbers. The color image recording portion 60 will be repeatedly operated in accordance with the input numbers of copying.

In the above described image recording apparatus according to the inhouse proposal, if the feed modes of the mask members are alternately carried out, i.e., one mode being from the printer portion 50, and another mode being manual insertion mode from the automatic sheet feeder F, surplus copying may be inadvertently given if the operator overlooks the key board manipulation for the manual insertion mode. That is, in the latter case, the previous mode (mask member feed from the printer) still remains in the controller 81, and already stored copying numbers read by the bar code sensor is used for the repeated copying even after the manual insertion of the set of the mask members. In other words, the manipulation to the key board is a requisite operation in case of the manual insertion of the mask members so as to obtain desired numbers of copying, otherwise already stored value read through the bar code is predominant to the copying numbers.

In order to overcome the deficiencies attendant to the inhouse proposal, an improved image recording apparatus has been provided, which will be described below as a first embodiment of the present invention. In the first embodiment, like part and components are designated by the same reference numerals and characters as those shown in FIG. 1. The first embodiment differs from the inhouse proposal in that a RAM 82 is provided with independent two memory regions, one for storing the data indicative of the copying numbers read from a bar code printed on the mask member, and an another for storing the data indicative of the copying numbers set by the key board, and in that a ROM 83 stores therein a program for an overall operation of the image recording apparatus, which program is different from that of the image recording apparatus according to the inhouse proposal.

Figure 3:
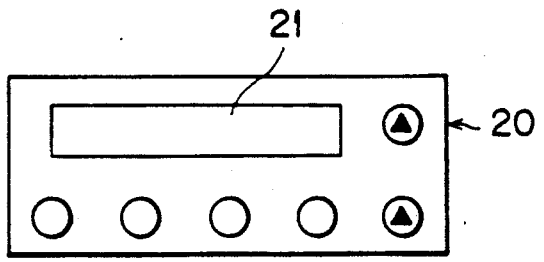
FIG. 3 is a plan view showing a panel switch used in the first embodiment.

More specifically, the first embodiment also includes a printer portion 50, a color image forming portion 60 and a controller 1. The controller 1 has a RAM 82 in which first and second memory regions 2 and 3 are independently provided. The fist memory region 2 is adapted to store therein a data read through the bar code which has been printed in the printer portion 50, the bar code being indicative of the intended copying numbers. On the other hand, the second memory region 3 is adapted to store therein a data set by manipulation of a panel switch 20 (FIG. 3) in case of the manual insertion of the mask member through the automatic feeder F. By the manipulation, the intended copying number is set. Further, the RAM also includes a flag set/reset region 84. The flag region 84 is adapted to be set if a mask member sensor 52 does not detect the mask member, so that the second memory region 3 becomes predominant over the first memory region 1. Furthermore, the panel switch 20 shown in FIG. 3 is connected to the controller 1. Intended copying numbers are inputted in the controller 1 by the manipulation to the panel switch, and the numbers are displayed on a display portion 21 such as a liquid crystal display.

Figure 4:
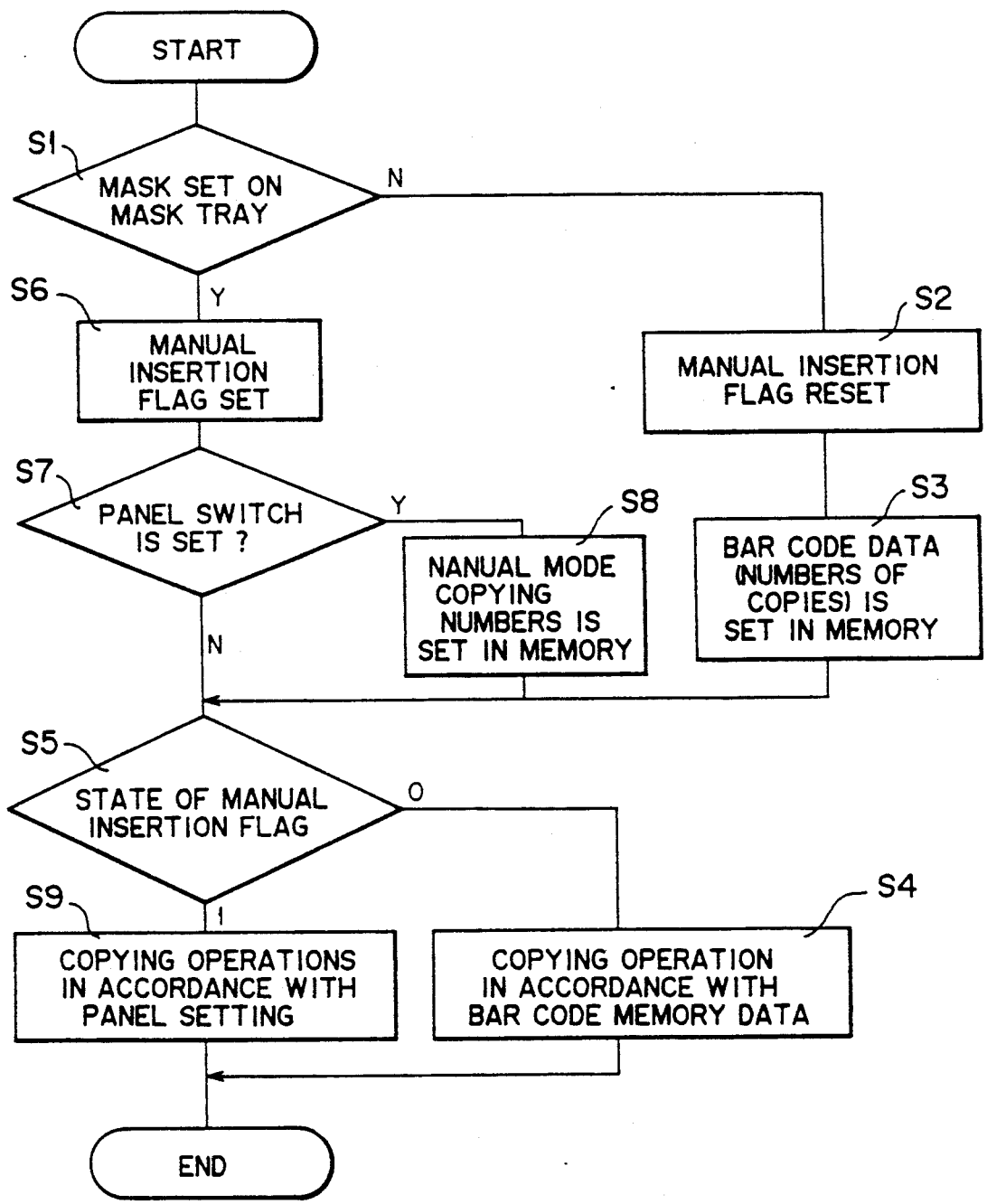
FIG. 4 is a flowchart showing an operational sequence in the image recording apparatus according to the first embodiment.

Next operations in accordance with the first embodiment will be described in conjunction with a flowchart shown in FIG. 4.

First, description is made with respect to the mask member feed mode from the printer 51 (not the manual insertion mode). In Step 1, the mask member is produced in the printer 51. In this case, determination is made as to whether or not the mask member undergoes manual insertion. The determination falls NO, so that the routine proceeds into Step S2. The mask member is fed past the mask sensor 52 and is directed to the mask position adjusting unit 61 from the printer portion 50. When the mask member passes through the mask member sensor 52, the manual mask insertion flag 84 is reset in Step S2, so that the bar code data read by the bar code sensor 62 becomes effective. The bar code data indicative of the previously determined copying numbers is stored in the bar code data storing region 2 in Step S3. As described above, in the printer portion 50, the bar code is printed on the mask member, the bar code being implicit on the desired copying numbers, so that the bar code data is read by the bar code sensor 62. Then, the routine proceeds into Step S5 where determined is the setting of the manual insertion flag. In case of the mask member feed mode from the printer, the flag is set to zero, and the routine proceeds into step S4.

With regard to the copying operation for producing a first output copying sheet in Step S4, the gate 65 is changed-over upon output drive signal from the controller 1 for selecting one of the storage tray (first tray) 64 and the mask discharge tray (second tray) 66 to which the first mask member such as the red mask member is temporarily introduced. The first mask member discharged from the printer 51 and introduced into the mask position adjusting unit 61 is exposed to light at the exposure unit 63, and the first mask member is delivered into on of the first and second storage trays. Similarly, subsequent mask member such as a green mask member is introduced into remaining one of the second and the first storage trays upon change over operation of the gate after the exposure operation. A third mask member such as a blue mask member is also exposed to light. The photosensitive pressure sensitive recording medium 72 is then taken up by the takeup roller 74. Incidentally, the contact plate 71 is elevated to brought into contact with the photosensitive pressure sensitive recording medium 72 through the mask member in each time of the exposure operation.

Accordingly, a latent image is provided on the image recording medium 72, and the medium 72 is superposed with the developer medium 75 at the pressure developing unit 73 for pressure developing operation. Therefore, the color visible output image is provided on the developer medium 75 which is then discharged onto the tray 76. Thus, the first copying operation is completed.

For the second copying operation using the identical set of the mask members, firstly, the blue mask member which has been lastly used in the first copying operation is first exposed to light, since the blue mask member is still on the mask position adjusting unit 61. After the exposure, the blue mask member is delivered to one of the mask member feed passage (functioning as a third storage tray) 67 and the storage tray (fourth storage tray) 68 after the change over operation of the gate 69. Next, the red mask member stored in one of the first and second storage trays 64 and 66 is again introduced onto the mask position adjusting unit 61, and undergoes exposure after the mask position adjusting operation. Then, the green mask member stored in the second or the first storage tray is also introduced into the exposure position. In step S4, required numbers of the copying operations are repeatedly carried out so as to produce the desired numbers of the output copying images in accordance with the bar code data.

Next, manual mask member insertion mode will be described. That is, another set of the mask members are manually set on the automatic sheet feeder tray F, and the mask members are successively introduced into the color image forming portion 60.

In this case, since no mask member is fed past the mask sensor 52, in Step S1, the determination falls Yes, and the mask insertion flag 84 in the controller 1 is set in Step S6. If the panel switch 20 is manipulated for inputting desired numbers of the copying by way of the manually inserted mask members, In step 7, the routine proceeds into Step S8. That is, in Step S7, a judgment is made as to whether or not the panel switch 20 is manipulated, and in Step S8, the input data of copying numbers is stored in the panel input copying number region 3. Then, in Step S5, the mask insertion flag is set to "1" because of the manual insertion mode, and in Step S9, the above described copying operation is repeatedly carried out in accordance with the data of copying numbers stored in the region 3.

On the other hand, if an operator is inadvertently overlook the manipulation to the panel switch in spite of the manual mask member feed mode, in Step S7, the judgment falls No, and the routine proceeds into Steps S5 and S9. That is, even if the mask member has a bar code data, the bar code data can be ignored in Step S5, so that the routine does not proceed to Step S4 but proceeds to Step S9. Even if the operator forgot to manipulate the panel switch for inputting the intended copying numbers, the panel input storing region (second memory region) 3 still stores the previously inputted data. Therefore, this data is utilized for the repeated copying operation. As a result, surplus copying is avoidable.

Generally, in case of the mask feed mode from the printer, great numbers of copying are contemplated, whereas in the manual mask insertion mode from the automatic feeder F, the intended copying numbers is smaller than that of the mask feed mode from the printer. In the first embodiment, if the mask feed mode is changed to the manual insertion mode, the intended copying number is based on the data stored in the second memory region 3 independent of the bar code data memory region (first memory region) 2. Consequently, the bar code data becomes invalid in case of the manual insertion mode, to thereby obviate surplus copying operations.

A second embodiment according to the present invention will next be described with reference to FIGS. 5 through 8. The second embodiment also aims to invalidate the bar code marks printed on the mask member even if such mask member is used to be installed on the manual insertion tray.

Figure 5:
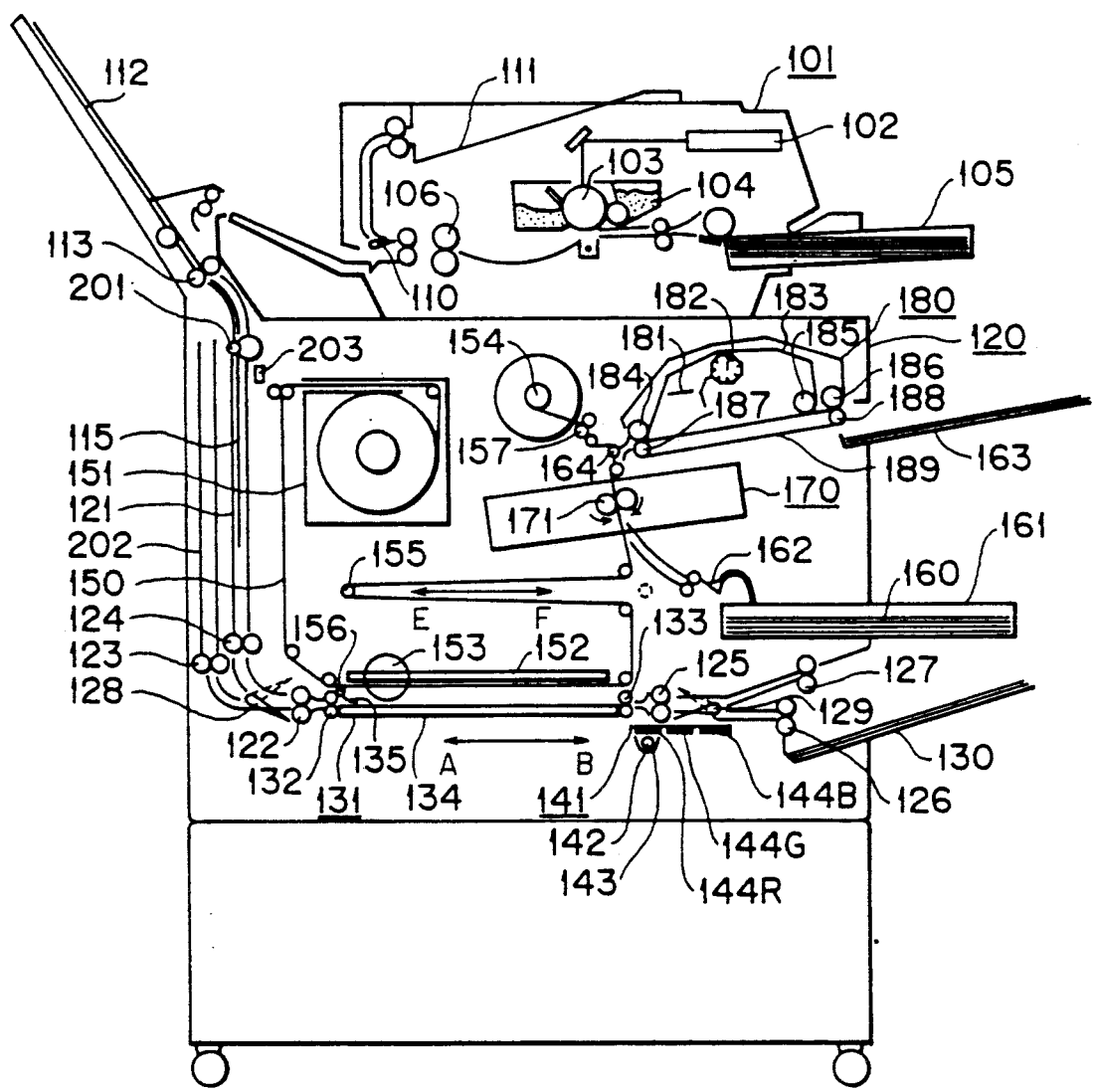
FIG. 5 is a schematic view showing an image recording apparatus using, mask members according to a second embodiment of this invention.

FIG. 5 shows a color image recording apparatus 120 coupled to a monochromatic laser beam printer 101 placed on the top of the apparatus 120. The laser printer 101 is generally adapted for recording data transmitted from a host computer. The laser beam printer 101 has a polygon scanner 102 which applies a laser beam to an electrically charged cylindrical photosensitive member 103 to form an electrostatic latent image on its outer circumferential surface. A developing unit 104 is disposed alongside of the photosensitive member 103 for developing the electrostatics latent image on the photosensitive member 103 into a visible toner image. An image transfer unit is positioned below the photosensitive member 103 for transferring the toner image from the photosensitive member 103 onto a sheet of plain paper or a OHP sheet.

A sheet cassette 105 storing a stack of the sheets of plain paper or OHP sheets is detachably inserted in the casing of the laser beam printer. The sheets in the sheet cassette 105 are fed one by one between the photosensitive member 103 and the image transfer unit by a sheet feed roller positioned near the sheet cassette. An image fixing unit 106 having a pair of fixing rollers is disposed downstream of the photosensitive member 103, and a sheet path selector 110 is disposed downstream of the image fixing unit 106. A sheet discharge tray 111 is disposed on the upper panel of the laser beam printer 101, whereas another sheet discharge tray (automatic sheet feeder ) 112 is positioned outside of the laser beam printer 101 downstream of its output slot near the sheet path selector 110. If a monochromatic or a black-and-white image is to be reproduced, then the printed sheet from the image fixing unit 106 is selectively discharged by the sheet path selector 110 onto the sheet discharge tray 111 or onto the automatic sheet feeder 112. If a colored image is to be reproduced, then the printed sheet from the image fixing unit 106 is first discharged onto the automatic sheet feeder 112, and then fed into the color image recording apparatus 120.

A set of three monochromatically printed sheets from the laser beam printer 101 is used as a set of mask members 115R, 115G, 115B (also referred to collectively as a mask member or members 115) in the color image recording apparatus 120. For this, a feed roller 113 is provided at an inlet portion of the image recording apparatus 120 so as to fed the each one of the mask members 115 one by one on the tray 112 into the apparatus 120. On each of the mask members 115, various marks M1 through M5 (FIG. 6) are printed.

The construction of the color image recording apparatus 120 will be described below.

A mask position adjusting device 131 is positioned at a lower internal space. Further, a mask transferring path 121 is defined between the automatic sheet feeder tray 112 and the mask position adjusting device 131. At one side of the mask position adjusting device 131, there are provided pairs of rollers 122, 123 and 124, a gate 128 and a mask storage portion 202, and at another side of the device 131, there are provided pairs of rollers 125, 126 and 127 and a gate 129. These gates 128 and 129 are pivotally movable as shown by solid lines and broken lines in FIG. 5. These roller pairs 122, 123, 124, 125 and 126 are subjected to sequential control for the copying operation by a control means (FIG. 7) in order to be rotatable in a normal or reverse direction. Thus, the mask members are fed in normal or reverse direction.

Further, at the mask transferring path 121, a pair of re-curl rollers 201 are provided so as to remove a curl given to the mask members 215 discharged out of the laser printer 101. Moreover, a bar code sensor 203 is also provided at a position adjacent the mask transferring path 121 for detecting a bar code data M5 (FIG. 6) printed on the mask members. The bar code sensor may be a light reflection type sensor provided by the combination of a light emitting diode (LED) and a photodiode. Furthermore, a mask member discharge tray 130 is provided at a position downstream of the roller pairs 126 and 127 so as to receive a used mask member.

The mask position adjusting unit 131 includes inlet pair of rollers 132, outlet pair of rollers 133 and a glass plate 134 positioned between the inlet and outlet pairs of rollers 132 and 133.

Figure 6:
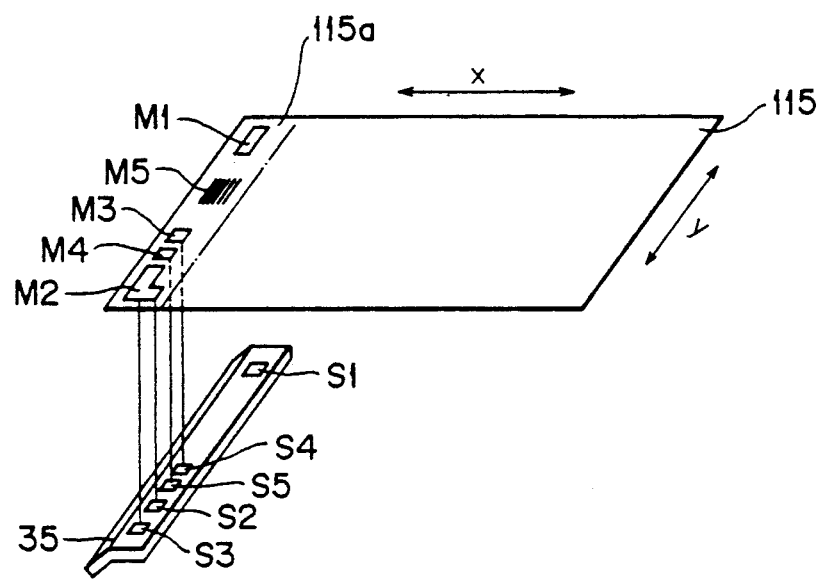
FIG. 6 is a partial perspective view showing a mask member and a sensor bar for detecting several kind of marks printed on the mask member according to the second embodiment of this invention.

FIG. 6 shows a sensor bar 135 and the mask member 115. As described above the mask member is printed with various marks. That is, at a non-imaging portion 115a of the mask member 115, provided are a mark M1 for rendering detection in running direction of the mask member 115 (x direction in FIG. 6), a mark M2 for rendering detection in both running and transverse directions of the mask member 115 (x and y direction in FIG. 6), marks M3 and M4 indicative of the kind of the mask member, and the mark M5 which is a bar code data indicative of the intended numbers of the copying. The sensor bar 135 is provided with corresponding sensors, such as a sensors S1 and S2 for detecting a position of the mask member with respect to its running direction (for detecting the marks M1 and M2), a sensor S3 for detecting transverse position of the mask member(for detecting the mark M2), and sensors S4 and S5 for detecting marks M3 and M4). These sensors S1 through S 5 are light reflection type sensors provided by the combination of a LED and a photo-diode. Incidentally, as described above, the bar code mark M5 is detected by the bar code sensor 203.

As shown in FIG. 5, an exposure device 141 is disposed at a position below the positioning device 131. The exposure device 141 is reciprocally movable horizontally along the positioning unit 131. The exposure device 141 includes a linear light source or lamp 142 for emitting white light, a reflecting member 143 for reflecting light from the light source 142, and a color separation filter unit 144 having three color separation filters 144R, 144G, 144B of red, green and blue. When the light source 142 is positioned below the position adjusting device 31, the light from the light source is projected onto the mask member 115 through the glass plate 134

A photosensitive recording medium or sheet 150 is primarily made of photocurable resins including a photopolymerization initiator known from Japanese Patent Application Kokai No. 62(1987)-143044, for example. More specifically, the photosensitive recording medium 150 includes a base sheet coated with photocurable resins which will be photocured upon exposure to lights having wavelengths of red, green, and blue, and microcapsules containing dye precursors of cyan, magenta, and yellow. The photosensitive recording medium 150 is housed in the form of a roll in a cartridge 151 in a light-shielded condition. The cartridge 51 is disposed upstream of the positioning unit 131. The photosensitive recording medium 150 is held under back tension by a shaft in its sheet roll on the cartridge 151.

An exposure table 152 is positioned above the mask position adjusting device 131. Further, a buffer roller 155 is movably positioned above the exposure table 152 for absorbing a sheet slack, and a pressure developing unit 170 having a pair of pressure rollers 171 is positioned above the buffer roller 155 for pressure developing operation. Furthermore, a separation roller 164 for separating the photosensitive recording medium 150 from a color developer sheet 160 (described later), a drive roller 157 and a takeup roller 154 are provided for winding the used photosensitive recording medium 150 thereover. The photosensitive recording medium 150 drawn out of the cartridge 51 passes through a space defined between the glass plate 134 and the exposure stand 152, and goes past the buffer roller 155, the pressure developing unit 170, the separation roller 164 and the drive roller 157, and is wound around the takeup roller 154.

The exposure table 152 is movable downwardly by a cam 153 for exposure operation by the exposure device 141, so that the mask member 115 transferred onto the glass plate 134 by the first pair of rollers 32 and photosensitive recording medium 150 are brought into intimate contact with each other. Further, a stationary roller 156 is positioned at a position adjacent to one side of the exposure stand 152 and therebelow. Therefore, when the exposure stand 152 is moved to a predetermined downward position, the exposure stand 152 is brought into intimate contact with the stationary roller 156, to thereby fix the photosensitive recording medium 150 at a given position in intimate contact with one of the mask members 115R, 115G and 115B. Accordingly, during the exposure operation to the photosensitive recording medium 50 through one of the mask members, the medium 150 is fixedly interposed between the exposure stand 152 and the stationary roller 156.

The color developer sheet 160 includes a base sheet coated with a color developer disclosed in Japanese Pat. Application Kokai No. 58(1983)-88739, for example. A stack of such color developer sheets 160 is stored in a cassette 161 with their coated surfaces facing downwardly. The color developer sheets 160 are fed, one by one, from the cassette 161 by a suction disc 162 which is intermittently operated, and supplied to the pressure developing unit 170. The supplied color developer sheet 160 is placed over the exposed area of the photosensitive recording medium 150, and pressed thereagainst by the pressure rollers 171 in the pressure developing unit 170, whereupon a latent image which has been formed on the photosensitive recording medium 150 by exposure to light from the exposure device 141 is visualized on the color developer sheet 160.

A thermal fixing unit 180 is also shown in FIG. 5. The unit 180 includes an upper segments having a casing 183, a heater 181 and a blade wheel 182 those housed in the casing 183, and a lower segments having a rubber rollers 184, 185, 186, another rollers 187 and 188 and an endless belt 189 mounted on the rollers 187, 188 for feeding the developer sheet 160 thereon. Further, a sheet discharge tray 163 is provided to receive thereon a finally treated developer sheet 160. The developer sheet 160 fed past the pressure developing unit 170 and the separation roller 164 is separated from the photosensitive recording medium 150 at the latter roller 164, and is then delivered into the thermal fixing unit 180 in order to impart a glossy image on the developer sheet, and is then discharged onto the discharge tray 163.

Figure 7:
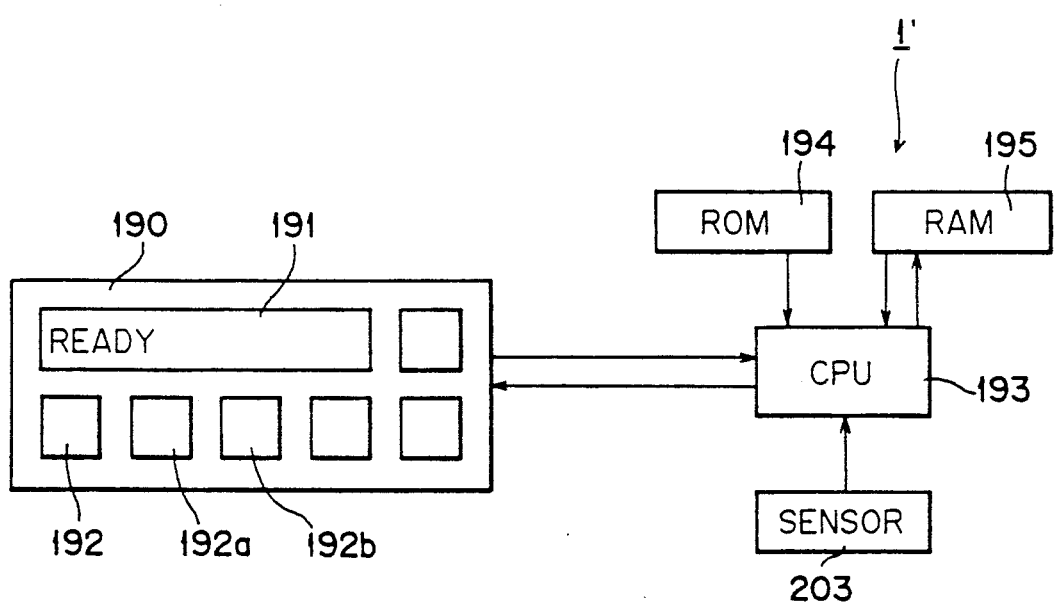
FIG. 7 is a schematic view showing a panel switch and a processor which performs processing to output copying numbers; and /

As shown in FIG. 7, a panel switch 190 for inputting numbers of copying in case of the manual insertion of the mask member is electrically connected to a controller 1'. The panel switch 190 includes a display portion 191 and keys 192 such as a mode change key 192a and a coping number set key 192b. The mode change key 192a is adapted to select one of an automatic mode in which the bar code printed on the mask member at the printer section 101 is read and used for producing the desired numbers of the copying in accordance with the bar code data, and a manual mode in which the mask members are initially and manually installed on the automatic sheet feeder tray 112. The controller 1' is provided by a microcomputer which mainly includes a CPU 193, a ROM 194 and a RAM 195. The bar code sensor 203 is connected to the CPU 193 as shown in FIG. 7.

The color image recording apparatus 120 thus constructed operates as follows:

First, a description is made with respect to the formations of a plurality of color output images by using a set of mask members 115R, 115G and 115B.

It is assumed that ar ed mask member 115R is produced by the monochromatic laser beam printer 1. More specifically, an electrostatic latent image is formed on the surface of the photosensitive member 103 by the polygon scanner 102 based on a red color data to be recorded or printed, and then toner particles are applied to the latent image by the developing unit 104, thus visualizing the latent image into a tone image as a light-shielding image. A sheet is fed from the cassette 5 toward the photosensitive member 103, and the light-shielding toner image on the photosensitive member 103 is transferred onto the sheet from the cassette 105 by the image transfer unit. Then, the sheet is fed to the image fixing unit 106 in which the toner image is fixed to the sheet with heat by fixing rollers. The sheet is thereafter discharged as the red mask member 115R onto the automatic sheet feeder tray 112 by the sheet path selector 110. The red mask member 115R thus produced carries the light-shielding toner image except which light can pass through the red mask member 115R to photocure those microcapsules which contain a dye precursor of cyan on the photosensitive recording medium 150.

If the mode change key 192a of the panel switch 190 has been had the automatic mode, the bar code data M5 printed on the red mask member 115R is detected by the bar code sensor 203, and therefore, the copying numbers are set in the controller. Then, the red mask member 115R is delivered to the automatic sheet feeder tray 112 from the printer 101, and is fed into the image recording apparatus 120 by the feed roller 113. In this case, the red mask member 115R is arcuately bent or curled toward its imaging side. Such red mask member 115R is delivered to the curl removing or correction rollers 201 through the mask transferring path 121, so that the curling is corrected. Then, the red mask member 115R is fed to the mask position adjusting device 131 by means of the roller pairs 124 and 122. In this case, the gate 128 has a solid line position in FIG. 5, so as to allow the red mask member 115R to pass therethrough and to reach the mask position adjusting device 131.

At the mask position adjusting device 131, the red mask member 115R is delivered to the exact exposure position by the rotation of the inlet pair of rollers 132, while the positioning marks M1 and M2 are detected by the sensors S1, S2 and S3 so as to precisely position the red mask member 115R at the exposure position.

Prior to the positional adjustment to the red mask member 115R, the exposure set and 152 is moved to the predetermined downward position by the cam 153. Therefore, one end (left end in FIG. 5) of the exposure stand 152 is brought into contact with the stationary roller 156, to thereby fix the photosensitive recording medium 150 to the exposure stand 152. After completion of the mask position adjustment, the exposure stand 152 is further moved downwardly by the cam 153, so that the exposure stand 152 is brought into intimate contact with the glass plate 134 of the mask position adjusting device 131. Accordingly, the red mask member 115R becomes intimate contact with the photosensitive recording medium 150.

When the exposure stand 152 is in close contact with the mask position adjusting device 131, the lamp 142 is turned on, and red light is applied from the red filter 144R through the mask member 115R to the photosensitive recording medium 150 while at the same time it is being scanned by the exposure device 141 in the direction indicated by the arrow A.

The light from the lamp 142 passes through the red filter 144R and is applied through the mask member 115R to the photosensitive recording medium 150 to expose the same, thus forming a latent image corresponding to the red mask member 115R on the photosensitive recording medium 150. After the exposure, the lamp 142 is de-energized, and the exposure device 141 moves back in the direction indicated by the arrow B. When the exposure device 141 moves back, the color separation filter assembly 144 is moved by an actuator (not shown) to position the next green filter 144G above the lamp 142. While the exposure device 141 is moving back, the exposure table 152 is elevated by the rotation of the cam 153 so that the photosensitive recording medium 150 is spaced away from the positioning unit 131 and the red mask member 115R.

At this time, the photosensitive recording medium 150 is held under back tension by the shaft in its roll in the cartridge 151. When the exposure table 152 is moved downwardly, the length of the photosensitive recording medium 150 which corresponds to the downward displacement of the exposure table 152 is drawn out of the cartridge 151 against the back tension. When the exposure table 152 is moved upwardly after exposure, the length of the photosensitive recording medium 150 which corresponds to the upward displacement of the exposure table 152 is pulled into the cartridge 151 because of the back tension, thereby taking up any sag in the photosensitive recording medium 150.

After the exposure using the red mask member 115R is completed, the exposure stand 152 is moved to a predetermined upward position by the cam 153. In this instance, the one end (left end in FIG. 5) of the exposure stand 152 maintains intimate contact with the stationary roller 156, so that the photosensitive recording medium 150 is still held to the exposure stand 152.

Then, the green mask member 115G produced by the monochromatic laser beam printer 101 is fed through the automatic sheet feeder tray 112, the feed roller 113, the curl removing roller 201, and reaches the pair of rollers 124 through the sheet transferring path 121. Immediately before the green mask member 115G reaches the pair of rollers 124, the roller pairs 122, 124, 125 and 127 and roller pairs 132 and 133 of the mask position adjusting device 131 are rotated for feeding the red mask member 115R rightwardly in FIG. 5, whereby the red mask member 115R is discharged out of the mask position adjusting device 131. Simultaneously, the green mask member 115G is fed to the exposure position and is stopped. In this case, the gates 128 and 129 have solid line positions. Therefore, the red mask member 115R is fed to the upper branched sheet feed path. If the tail end of the red mask member 115R is fed past the gate 129, free switching operation to the gate 129 is attained, whereupon the rotation of the roller pair 127 is stopped. Accordingly, the red mask member 115R is suspended from the rollers 127 with a part of the red mask member 115R being interposed by the rollers 127.

The green mask member 115G fed onto the mask position adjusting device 131 is subjected to position adjustment relative to the photosensitive recording medium 150, similar to the position adjustment in case of the red mask member 115R. Then, the exposure stand 152 is moved downwardly, so that the photosensitive recording medium 150 and the green mask member 115G are brought into intimate contact with the glass plate 134 of the mask position adjusting device 131. Thereafter, the lamp 142 is turned on for exposing the photosensitive recording medium to green light through the green filter 144G. Upon completion of the exposure, the exposure stand 152 is moved to the predetermined upward position. The exposure device 141 restores its original position, and at the same time, the filter unit 144 is moved for positioning the blue filter 144B above the lamp 142.

Next, the blue mask member 115B produced at the laser printer 101 is fed into the image recording apparatus 120 in a manner the same as that in the case of the red and green mask members. When the blue mask member 115B is fed to a position immediate upstream of the pair of rollers 124, the roller pairs 124, 122, 125 and 126 and rollers 132 and 133 of the mask position adjusting device 131 are rotated for feeding the mask members rightwardly in FIG. 5. Therefore, the green mask member 115G is discharged out of the mask position adjusting device 131, and at the same time, the blue mask member 115B is brought to the exposure position. In this case the gate 128 has a solid line position in FIG. 5 whereas the gate 129 has a broken line position. Accordingly, the green mask member 115G can pass through the gate 129 and is interposedly held between the lower pair of rollers 126 with a leading end portion of the mask member 115G being suspended from the lower pair of rollers 126. The rotation of the rollers 126 is stopped when the green mask member 115G is interposed therebetween.

The blue mask member 115B fed into the mask position adjusting device 131 is brought into intimate contact with the photosensitive recording medium 150 in a manner the same as above, and the medium 150 is exposed to blue light through the blue filter 144B and the blue mask member 115B.

With the above operations, a color latent image is formed on the photosensitive recording medium 150. Then, the exposure stand 152 is elevated to its original position. In this case, the one end (left end in FIG. 5) of the exposure stand 152 is moved away from the stationary roller 156 and the buffer roller 155 is moved in a direction indicated by an arrow E. Accordingly, unexposed zone of the medium 150 subsequent to the thus exposed area is pulled out of the cartridge 151 and is moved to a position below the exposure stand 152. On the other hand, the rotation of the drive roller 157 is stopped when the leading end of the precedent latent image area reaches the pressure roller 171 of the pressure developing unit 170.

In synchronism with the movement of the photosensitive recording medium 150, the color developer sheet 160 is delivered from the cassette 161. The color developer sheet 160 from the cassette 161 is stopped when its leading edge faces the leading end of the latent image on the photosensitive recording medium 150.

The pressure rollers 171 of the pressure developing unit 170 are then rotated by a drive source (not shown) in directions indicated by arrows in FIG. 5 and held against each other. In this case, the exposure stand 152 is again moved downwardly, so that the photosensitive recording medium 150 is fixed between the left end of the exposure stand 152 and the stationary roller 156.

The photosensitive recording medium 150 and the color developer sheet 160 which are held in superposed relation to each other are pressed together. At this time, those microcapsules which are not photocured on the photosensitive recording medium 150 are ruptured under pressure, and a colored visible image corresponding to the latent image on the photosensitive recording medium 150 is developed on the color developer sheet 160.

As the pressure rollers 171 rotate in the directions indicated by the arrows in FIG. 5, the buffer roller 155 is moved in the direction indicated by the arrow F. When the leading edge of the developer sheet 160 reaches the separation roller 164, the developer sheet 160 is separated from the photosensitive recording medium 150, and is fed to the thermal fixing unit 180.

In the thermal fixing unit 180, air heated by the heater 181 is circulated within the casing 183 by the blade wheel 182. Therefore, the color developer sheet 160 is heated and the coloring is promoted on the sheet 160. At the same time, binder polymer by which the color developer materials are fixed to the base sheet of the color developer sheet 160 is thermally fused for thereby securing the color developer materials to the base sheet. Further the color developer sheet 160 is calendered to have an even smoothness along its length the same as that of the endless belt 189, so that the color developer sheet 160 has a suitable glossy surface. After the color developing and calendering process, the color developer sheet 160 is separated from the endless belt 189, and is discharged onto the discharge tray 163.

During the pressure developing process and the color developing process and calendering process described above, the photosensitive recording medium 150 is gripped and fastened in a place between the exposure stand 152 and the stationary roller 156. Therefore, another exposure operation can be carried out on the exposure stand 152 with respect to the subsequent area of the photosensitive recording medium while the pressure developing operation is concurrently performed with respect to the precedent area of the photosensitive recording medium 150.

When it is desired to reproduce a plurality of colored images with the same set of mask members 115, the roller pairs 122, 124, 127, 125 and rollers 132 and 133 of the mask position adjusting device 131 are reversely rotated. Further, the gates 128 and 129 have their solid line positions in FIG. 5. Therefore, the blue mask member 115B positioned on the exposure position is fed back to the pair of rollers 124, passed through the gate 128 and is interposed between the pair of rollers 124. When the trailing edge is fed past the gate 128, the rotation of the rollers 124 is stopped for holding the blue mask member 115B therebetween. On the other hand, the red mask member 115R which has been held between the upper pair of the rollers 127 is fed back into the mask position adjusting device 131 by the reversal rotations of the roller pairs 27, 25, 33 and 32, and undergoes position adjustment. Then, the photosensitive recording medium is subjected to red light exposure through the red filter 144R and through the red mask member 115R.

Then, the roller pairs 122, 123, 126 and 125 and the rollers 132, 133 of the mask position adjusting device 131 are reversely rotated. Further, the gates 128 and 129 are shifted to have their broken like positions in FIG. 5. Therefore, the red mask member 115R positioned at the exposure position is further fed back toward the pair of rollers 123, passed through the gate 128 and is interposed between the pair of rollers 123, when the trailing edge of the red mask member 115R is fed past the gate 128, the rotation of the rollers 123 is stopped for holding the red mask member 115R therebetween. On the other hand, the green mask member 115G which has been held between the lower pair of the rollers 126 is fed back into the mask position adjusting device 131 through the gate 129 because of the reversal rotations of the rollers 126, 125, 133 and 132. The green mask member 115G is subjected to position adjustment, and the photosensitive recording medium 150 is exposed to green light through the green filter 144G and through the green mask member 115G.

Then, the green mask member 115G positioned at the exposure position is fed toward the lower pair of rollers 126 by rotating the rollers 132, 133, 125 and 126 in their normal direction. Thereafter, the blue mask member 115B which is held by the pair of rollers 124 is fed to the mask position adjusting device 31 by rotating the rollers 124, 122, 132 and 133 in their normal direction, and exposure operation with blue light is carried out. As a result, a color latent image is formed on the photosensitive recording medium 150 by superposing exposures at three times, and a visible color image is formed on the developer sheet 160 by the operations the same as above. These operations are repeatedly carried out in order to obtain desired numbers of color copies with the set of the mask members 115R, 115G and 115B.

After the desired number of color images have been reproduced from the same set of mask member 115, the mask members are discharged onto the discharge tray 130 through the upper or lower pairs of the rollers 127 and 126.

If the mask member 115 of a next set happen to be fed from the monochromatic laser printer 101 while a series of colored images are being reproduced in the color image recording apparatus 120, the next set of the mask members are temporarily stored onto the automatic sheet feeder tray 112. If the series of the color reproductions are completed, the stored next set of the mask members are fed into the image recording apparatus 120 one by one by means of the feed rollers 113.

In the second embodiment, the already employed mask members 115 are reused. For example, the mask members discharged onto the tray 130 may again be used for next copying operation. More specifically, the already used mask members 115 are manually set on the automatic sheet feed tray 112 so as to introduce the mask members into the color copying device 120. As described above, the mask members are printed with the bar code data M5 indicative of the desired numbers of copying. If the operator manipulates the panel switch 190 to select the automatic mode on the key 192a, the bar code data M5 is detected by the bar code sensor 203 for setting the copying numbers. On the other hand, if a desired numbers of copying is different from the numbers attendant to the bar code data, the manual mode is selected upon manipulation to the key 192a, and newly intended copying numbers are input through the copying number set key 192b. As a result, the bar code data on the mask member 115 becomes invalid.

Figure 8:
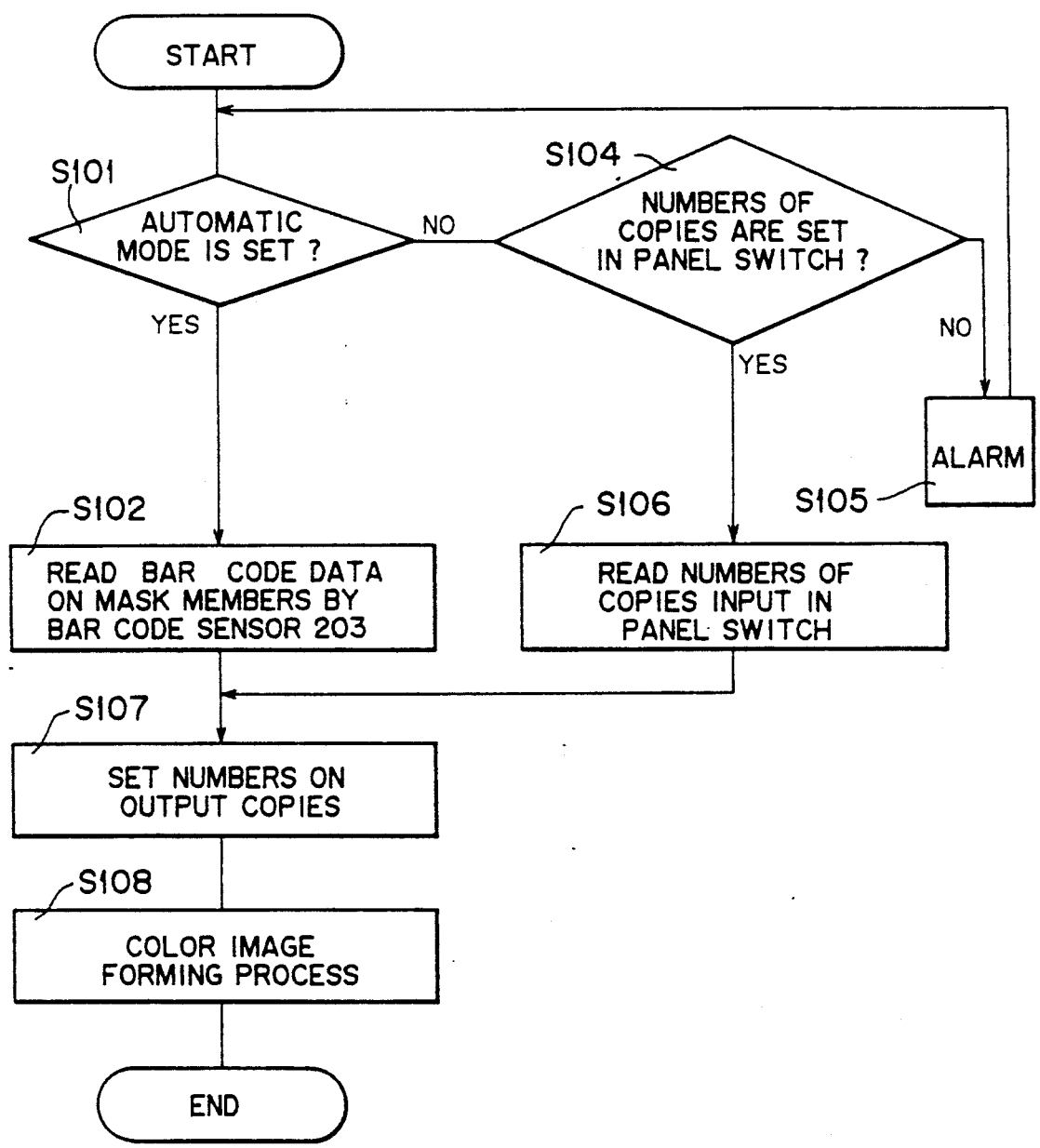
FIG. 8 is a flowchart showing an operational sequence of the image recording apparatus according to the second embodiment of this invention.

In this connection, FIG. 8 shows a flowchart for description of a process of setting the copying numbers and exact copying operations. In Step S101, determination is made as to whether or not the mode change key 192a is changed over to the automatic mode. If the judgment falls Yes, the routine proceeds into Step S102 in which the bar code sensor 203 reads the bar code data printed on the mask member 115. Thus, in Step S103, the read bar code data is set as the numbers of copying. On the other hand, in Step S101, if the determination falls No, that is, the mode change key 192a is changed over to the manual mode, the routine proceeds into Step S104 where determination is made as to whether or not the copying numbers have been inputted through the copying number set key 192b. If the judgment falls No, in Step S105, alarm is displayed, so that an operator manipulates the copying number set key 192b for setting the copying numbers in case of the manual mode. Thereafter, the routine returns to Step S101. On the other hand, if the judgment in Step S104 falls Yes, the routine proceeds into Step S106 where copying numbers set by the manipulation to the copying number set key 192b is read, and the read data is set as the required output copying numbers in Step S107. Thereafter, in Step S108, color copying operation is repeatedly carried out as described above in accordance with the copying numbers set in Step S107. When the desired numbers of copying are obtained, the routine is ended.

As described above, in the second embodiment of the present invention, since the mode change key 192a is provided, and the change-over mode is judged by the controller 1', even if the bar code data is printed on the mask member in case of the manual mode, the bar code data can be invalidated so as to provide desired numbers of copying in the manual mode. The manual mode and the automatic mode can be freely changed-over by the manipulation to the mode change key. In other words, in the present invention, the mask member printed with the bar code data can be used even in the manual mode.

While the invention has been described in detail and with reference to specific embodiments thereof, it would be apparent to those skilled in the art that various changes and modifications can be made therein without departing from the spirit and scope of the invention.

What is claimed is:

1. An image recording apparatus for recording a color image with using mask members, each of the mask members being formed with a light shieldable mask image and each of the mask members being successively fed toward a photosensitive recording medium at an exposure position for superposedly forming latent images thereon upon exposures, the apparatus comprising;
   a printer portion for producing the mask members, the printer portion providing an automatic mask member feed mode and also providing means for indicating copying numbers for the automatic feed mode with respect to the mask members;
   a color image forming portion for forming an output color image with using the mask members, each of the mask members being introducible from the printer portion to the color image forming portion along a first path, the photosensitive recording medium and the exposure position being positioned within the color image forming portion;

sheet feed means for manually setting another set of mask members and for introducing the another set into the color image forming portion along a second path, the sheet feed means providing a manual mask member feed mode;

means for inputting another copying numbers in case of the manual mask member feed mode; and means for invalidating the copying numbers indicated by the indication means and for predominating the another copying numbers if the manual mask member feed mode is selected.

2. The image recording apparatus is claimed in claim 1, wherein the means for invalidating and predominating comprises:

first means connected to the inputting means for storing the another inputting copying numbers;

means for detecting the copying numbers indicated by the indication means;

second means connected to the detecting means for storing the input copying numbers;

means for judging the mask member feed mode, and control means connected to the first and second storing means and the judging means for controlling an operation of the color image forming portion to produce output images at the inputted copying numbers stored in the second storing means as a result of judgment falling to the automatic mask member feed mode, and to produce output images at the another inputted copying numbers in accordance with the another inputting copying numbers stored in the first storing means as a result of judgment falling to the manual mask member feed mode.

3. The image recording apparatus as claimed in claim 2, wherein the inputting means comprises a panel switch on which the another inputting copying numbers is to be manipulated.

4. The image recording apparatus as claimed in claim 3, wherein the judging means comprises a mask member sensor for detecting the mask members fed in the first path.

5. The image recording apparatus as claimed in claim 2, wherein the means for indicating copying numbers comprises a print means for printing bar codes on the mask members, the bar code being indicative of the copying numbers in case of the automatic mode, and wherein the second storing means stores therein the bar code data.

6. The image recording apparatus as claimed in claim 1, wherein the means for invalidating and predominating comprises:

means for detecting the copying numbers indicated by the indication means;

switching means for selecting one of the automatic mode and the manual mode; and control means comprising judging means for judging the mode, and copying number setting means connected to the judging means for setting copying numbers in accordance with the detected copying numbers as a result of judgment falling to the automatic mode and in accordance with the another copying numbers as a result of judgment falling to the manual mode.

7. The image recording apparatus as claimed in claim 6, wherein means for detecting the copying numbers comprises a bar code sensor, the bar code being provided by the indication means for representing the copying numbers in the automatic mode.

* * * * *